United States Patent
Pillay Narrainen et al.

(10) Patent No.: US 10,246,633 B2
(45) Date of Patent: Apr. 2, 2019

(54) HIGHLY STABLE QUANTUM DOT-CONTAINING POLYMER FILMS

(71) Applicant: Nanoco Technologies Ltd., Manchester (GB)

(72) Inventors: Amilcar Pillay Narrainen, Manchester (GB); Cong-Duan Vo, Manchester (GB); Imad Naasani, Manchester (GB); Abu Mohammad Imroz Ali, Altrincham (GB)

(73) Assignee: Nanoco Technologies Ltd., Manchester (GB)

( * ) Notice: Subject to any disclaimer, the term of this patent is extended or adjusted under 35 U.S.C. 154(b) by 73 days.

(21) Appl. No.: 15/429,845

(22) Filed: Feb. 10, 2017

(65) Prior Publication Data

US 2017/0233644 A1   Aug. 17, 2017

Related U.S. Application Data

(60) Provisional application No. 62/294,783, filed on Feb. 12, 2016.

(51) Int. Cl.

| | |
|---|---|
| *C09K 11/02* | (2006.01) |
| *C08J 5/18* | (2006.01) |
| *H01L 33/06* | (2010.01) |
| *C09K 11/08* | (2006.01) |
| *H05B 33/20* | (2006.01) |

(52) U.S. Cl.
CPC ............... *C09K 11/02* (2013.01); *C08J 5/18* (2013.01); *C09K 11/025* (2013.01); *C09K 11/08* (2013.01); *H01L 33/06* (2013.01); *H05B 33/20* (2013.01); *C08J 2335/02* (2013.01)

(58) Field of Classification Search
CPC .................................. C09K 11/02; C08J 5/18
USPC .......................................................... 428/323
See application file for complete search history.

(56) References Cited

U.S. PATENT DOCUMENTS

| | | | |
|---|---|---|---|
| 2015/0047765 A1 | 2/2015 | Vo et al. | |
| 2015/0267106 A1 | 9/2015 | Pillay Narrainen et al. | |
| 2015/0275078 A1* | 10/2015 | Vo ........................ | C09K 11/703 252/301.36 |

FOREIGN PATENT DOCUMENTS

WO      20150153148 A1    8/2015

* cited by examiner

*Primary Examiner* — Deve E Valdez
(74) *Attorney, Agent, or Firm* — Blank Rome, LLP

(57) ABSTRACT

Highly stable films containing semiconductor nanoparticles ("quantum dots") are prepared from resins containing a fast-curing inner phase having a high glass transition temperature ($T_g$) and certain inner phase/outer phase combinations. The resins may comprise an inner phase and outer phase (but may appear to be a single phase due to their homogeneous appearance when viewed using an optical microscope). The method provides a highly scalable and cost-effective procedure for preparing films that are resistant to light, elevated temperatures, moisture, and oxygen.

16 Claims, 9 Drawing Sheets

HIGHLY STABLE QUANTUM DOT-CONTAINING POLYMER FILMS

CROSS-REFERENCE TO RELATED APPLICATIONS:

This application claims the benefit of U.S. Provisional Application No. 62/294,783, filed on Feb. 12, 2016, which is hereby incorporated by reference in its entirety.

STATEMENT REGARDING FEDERALLY SPONSORED RESEARCH OR DEVELOPMENT

Not Applicable

BACKGROUND OF THE INVENTION

1. Field of the Invention

The present invention generally relates to semiconductor nanoparticles ("quantum dots"). More particularly, it relates to polymer films incorporating heavy metal-free quantum dots.

2. Description of the Related Art including information disclosed under 37 CFR 1.97 and 1.98.

Multi-phase and two-phase polymer films containing heavy metal-free semiconductor nanoparticles dispersed in an inner phase which is then dispersed in a suitable gas barrier outer phase have been described previously—see, e.g., U.S. Pub. No. 2015/0047765 "Quantum dot films utilizing multi-phase resin" and U.S. Pub. No. 2015/0275078 "Quantum dot compositions."

However, there have been many challenges in obtaining truly stable films especially under testing conditions that include a dark test (0/60/RH) [0 mW/cm$^2$ irradiance/at 60° C./RH=room humidity (not measured)] in addition to a light test (106/60/90) [90% relative humidity]. The dark test is especially challenging for currently available red-emitting quantum dots (QDs) utilized in conjunction with barrier films having a water vapor transmission rate (WVTR) on the order of 10$^{-2}$ g/m$^2$ day (e.g., i-Components TBF1004 barrier film, i-Components Co. Ltd., 701, Family Tower, 958-2, Youngtong-dong, Paldal-gu Soowon-si, Gyeonggi-do, Korea) having a resin film thickness of 50 microns or less.

BRIEF SUMMARY OF THE INVENTION

This invention concerns the preparation of highly stable films from resins containing a fast-curing inner phase preferably having a high glass transition temperature ($T_g$) (preferably greater than 35° C. and more preferably greater than 80° C.) and certain inner phase/outer phase resin combinations. The resins described consist of an inner phase and outer phase but in some cases may be referred to as a single phase due to their homogeneous appearance when viewed using an optical microscope. The method of the invention provides a highly scalable and cost-effective way of preparing stable films.

Herein, stability test conditions are reported as "(x/y/z)" where x is the irradiance in mW/cm$^2$; y is the temperature in ° C.; and z is the relative humidity in percent.

The following abbreviations, acronyms, and trade names are used throughout this disclosure:

IPM isopropyl myristate
YR011 acrylate functionalized silica nanoparticle resin from Showa Denko K.K. (Shiba Daimon, Minato-ku Tokyo JAPAN)
AEROSIL® R106 fumed silica (EVONIK DEGUSSA GMBH Rellinghauser Strasse 1-11 45128 Essen FED REP GERMANY)
CN104 bisphenol A epoxy diacrylate oligomer from Sartomer (Sartomer Technology USA, LLC Suite 202, 103 Foulk Rd., Wilmington Del. 19803)
CN104B80 bisphenol A epoxy diacrylate blend from Sartomer
CN104C80 80/20 blend of CN104 and 2-hydroxyethyl acrylate (HEA)
CN104E70C5 70/20/5 blend of CN104, 2-hydroxymethyl methacrylate (HEMA) and 2-hydroxyethyl acrylate (HEA)
CN146 monofunctional adhesion-promoting acrylic oligomer from Sartomer
SR833S tricyclodecane dimethanol diacrylate (a low-viscosity bifunctional acrylate monomer that can be polymerized by free radicals)
LMA lauryl methacrylate
TMPTMA trimethylolpropane trimethacrylate
IRG651 IRGACURE® 651 (2,2-dimethoxy-1,2-diphenylethan-1-one) photo-initiator from BASF (BASF SE Carl-Bosch-Strasse 38 Ludwigshafen GERMANY)
IRG819 IRGACURE® 819 (bis(2,4,6-trimethylbenzoyl)-phenylphosphineoxide) photo-initiator from BASF
IBOA isobornyl acrylate
YR301 another acrylate-functionalized silica nanoparticle resin from Showa Denko K.K.
TMPTA trimethylolpropane triacrylate
CITHROL DPHS PEG 30 dipolyhydroxystearate surfactant (Croda International Plc, Snaith, Goole, East Yorkshire DN14 9AA UK)
IPM isopropyl myristate
TCDMDA tricyclodecane dimethanol diacrylate
LA lauryl acrylate
HEA 2-hydroxyethyl acrylate
HEMA 2-hydroxyethyl methacrylate
4-hydroxy-TEMPO free-radical inhibitor (4-Hydroxy-2,2,6,6-tetramethylpiperidine 1-oxyl, or "TEMPOL")

BRIEF DESCRIPTION OF THE SEVERAL VIEWS OF THE DRAWING(S)

DETAILED DESCRIPTION OF THE INVENTION

Figure 1:
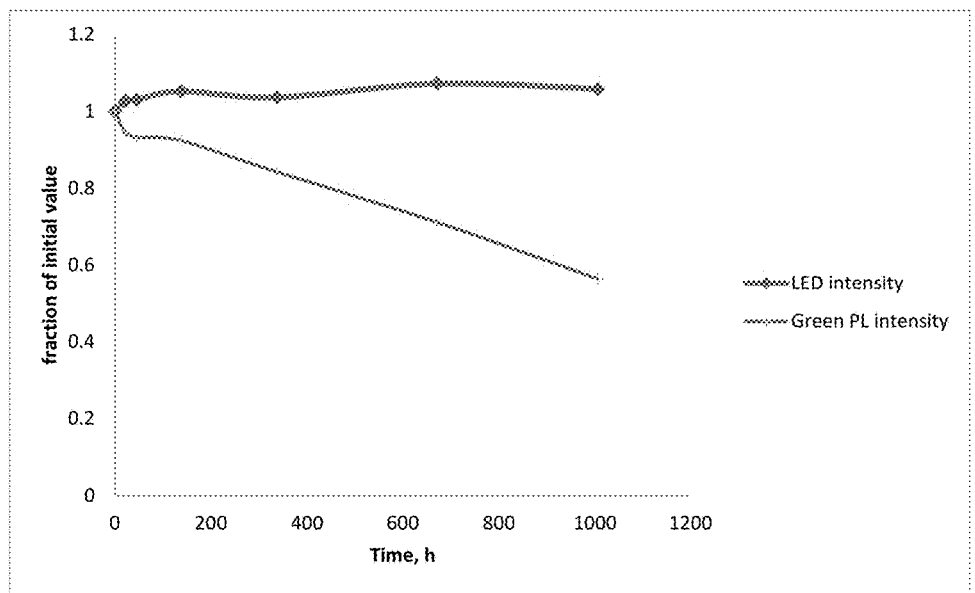
FIG. 1 is a graph showing the results of a light stability test for film prepared from 281C resin (IBOA/(YR011/0.36 wt. % IRG819)).

From a series of experiments it was discovered that, the higher the phase separation between the inner and outer phases, the better the gas barrier properties of the barrier resin are maintained. For example, IPM/Aerosil R106 inner phases showed good back light unit (BLU) stability (2.5 mW/cm$^2$) when used with a bisphenol A epoxy diacrylate outer phase (CN104B80 from Sartomer) but very poor stability with significant edge ingress of oxygen and/or moisture in cuts from the barrier film laminated sample when used with YR011 (acrylate functionalized silica nanoparticle resin from Showa Denko K.K.) or a 50:50 wt. % acrylic oligomer (CN146 from Sartomer)/tricyclodecane dimethanol diacrylate (TCDMDA or SR833S from Sartomer) outer phase. The polarity of the CN104B80 in this application is important to provide good phase separation and less contamination of the outer phase with uncured liquid. However, this limits the scope of this inner phase in formulations and the interaction between inner and outer phase will likely increase as efforts to increase emulsion stability of these resins are made. A higher viscosity of the inner phase or outer phase may be important in reducing the diffusion of the inner phase into the outer phase as evidenced by the greater edge ingress in the barrier film laminated sample observed in films from IPM-only/YR011 resin (233A) as compared to the higher viscosity (IPM/Aerosil R106)/YR011 resin (233B).

When a cured inner phase of lauryl methacrylate/trimethylolpropane trimethacrylate (LMA/TMPTMA) was used, more stable films were obtained for YR011 and for 50:50 wt. % CN146/SR833S blend despite the fact that greater diffusion of the more polar inner phase (as compared to IPM) into the outer phase might be expected in these systems.

Experiments using the same outer phases with heavy metal-free semiconductor nanoparticle beads to prepare resins exhibited better stability than cured inner phase resin. The beads were prepared from LMA/TMPTMA but contained a higher proportion of TMPTMA cross-linker and were fully cured before mixing with the outer phase. It was concluded that full curing of the inner phase is necessary in these systems in order to minimize the reduction of gas barrier properties due to the mixing of soft, uncured, inner phase into the outer phase. Because of the time-scale of polymerization of the two-phase resins (30 seconds under mercury lamps), an acrylate as opposed to a methacrylate inner phase may provide a more suitable curing system.

Experiments using isobornyl acrylate (IBOA) and IBOA/lauryl acrylate (LA) as an inner phase were carried out with YR011, YR301 and CN104C80 (CN104:2-hydroxyethyl acrylate (HEA)=80:20 wt. %) as the outer phase. IBOA was chosen because of its high $T_g$ (94° C. per Sigma Aldrich) and would result in a lesser amount of soft material in the outer phase than LA. A combination of LA and IBOA was used to provide more flexibility in the film which may be needed in a roll-to-roll process. LA also offers slightly better compatibility with heavy metal-free semiconductor nanoparticles than IBOA. A summary of some of the experiments carried out and results obtained are presented in TABLE 1 and TABLE 2. PLQY measurements were made using a Hamamatsu instrument and EQE values were obtained using a LABSPHERE® integrating sphere (LABSPHERE INC. 231 Shaker Street NORTH SUTTON NEW HAMPSHIRE 03260).

Examples of acrylate monomers having relatively high glass transition temperatures ($T_g$) or melting temperatures ($T_m$) include: Behenyl Acrylate (BEA, $T_g$=54° C.); tent-Butyl Acrylate (TBA, $T_g$=43-107° C.); Dihydrodicyclopentadienyl Acrylate (DCPA, $T_g$=110° C.); and Stearyl Acrylate (SA, $T_m$=41-49° C.).

Examples of methacrylate monomers having relatively high glass transition temperatures ($T_g$) or melting temperatures ($T_m$) include: Behenyl Methacrylate (BEMA, $T_m$=44° C.); tert-Butyl Methacrylate (TBMA, $T_g$=117° C.); Cyclohexyl Methacrylate (CHMA, $T_g$=105° C.); and Methyl methacrylate (MMA, $T_g$=105° C.).

TABLE 1

Resins prepared for comparing acrylate and methacrylate inner phases with YR011-, YR301-, and CN104-based outer phases.

| Exp | Inner phase (20 wt. %) | Outer phase (80 wt. %) | Quantum dots | mg/g |
|---|---|---|---|---|
| 281A | LMA/TMPTMA (9:1 mol) and IRG819/651 (13.5 mg and 4.5 mg/10 mmol) | YR011 and IRG819 (0.36 wt. % initiator) - no inhibitor | Green 414_blend (PL = 523 nm) | 10.2 |
| 281B | LA/IBOA (67 wt. % LA) and IRG819 (0.5 wt. %) | YR011 and IRG819 (0.36 wt. % initiator) - no inhibitor | Green 440 (PL = 523 nm) | 13.3 |
| 281C | IBOA and IRG819 (0.5 wt. %) | YR011 and IRG819 (0.36 wt. %) - no inhibitor | Green 440 (PL = 523 nm) | 13.3 |
| 282A | IBOA and IRG819 (0.5 wt. %) | YR011 and IRG819 (0.36 wt. %) - no inhibitor | Green 440 (PL = 523 nm) | 13.3 |
| 282B | IBOA and IRG819 (0.5 wt. %) | YR301 and IRG819 (1 wt. %) - no inhibitor | Green 440 (PL = 523 nm) | 13.3 |
| 298A and B (A = 15 s curing B = 30 s curing) | IBOA and IRG819 (0.5 wt. %) | CN104C80 and IRG819 (1 wt. %) - with inhibitor | Green 421 and red 098 | 7.58 green/ 0.621 red |

Note:
samples 281C and 282A are the same.

TABLE 2

Optical properties of films prepared from the resins listed in TABLE 1. Films were ca.100-μm thick and were coated between i-Component 125-μm barrier films. Curing was carried out under mercury lamps for 30 seconds except for 298A which was carried out for 15 seconds.

| | DAY 0 | DAY 1 | DAY 6 | | |
|---|---|---|---|---|---|
| Exp | PLQY (%) | EQE/Abs (%) | EQE/Abs (%) | EQE/Abs (%) | Ingress (mm) | PL (nm) |
| 281A | 52 | 45/23 | 43/25 | 40/24 | ~1 | 544 |
| 281B | 60 | 52/31 | 51/32 | 49/32 | ~0.6 | 541 |
| 281C | 60 | 55/32 | 53/34 | 52/34 | ~0.3 | 541 |
| 282A | 60 | 53/32 | 53/33 | 52/32 | ~0.3 | 542 |
| 282B | 54 | 48/33 | 49/34 | 48/34 | <0.1 | 543 |
| 298A | 48 | 44/29 | — | — | — | — |
| 298B | 48 | 43/29 | — | — | — | — |

(samples 281C and 282A illustrate sample-to-sample variation)

For YR011 outer phase with 0.36 wt. % IRG819, it was found that an IBOA-only inner phase gave the least edge ingress due to moisture and/or oxygen degradation observed in the barrier film laminated samples on a BLU. It was previously found that increasing the concentration of IRG819 in YR011 to 1 wt. % significantly increased the stability of (LMA/TMPTMA)NR011 resins. It is contemplated that the main reason for this is that the curing of diffused LMA/TMPTMA into the outer phase is significantly increased at this higher initiator concentration. A new, less-expensive, acrylate-functionalized, silica nanoparticle resin (YR301) was also tested with an IBOA inner phase in 282B at the higher photoinitiator concentration. The edge ingress on this sample was significantly less than for other samples. It is noted that the IBOA/(YR301 or YR011) showed significantly better emulsion stability than LMA/TMPTMA indicating that the more polar IBOA was diffusing and interacting more with the outer phase. The increased stability of the IBOA samples compared to LA or LMA based inner phases implies that the use of a fast-curing, high-$T_g$ inner phase may be critical in maintaining gas barrier properties. In general, acrylates are preferred over methacrylates due to their higher propagation rate constants for the radical polymerization reactions that may be utilized.

Figure 2:
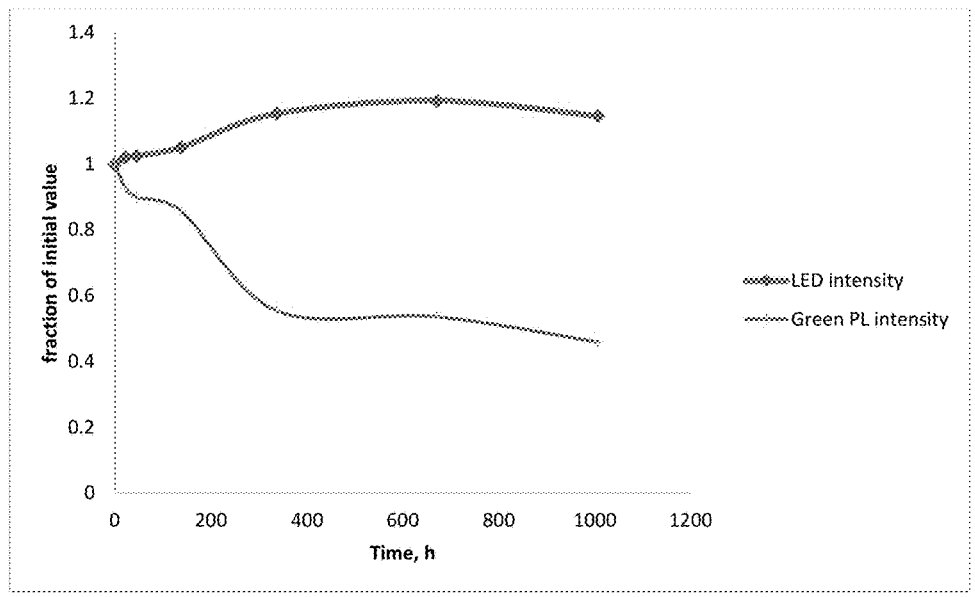
FIG. 2 is a graph showing the results of a light stability test for film prepared from 282B resin (IBOA/(YR301/1 wt. % IRG819)).

All the above samples with acrylate-functionalized silica nanoparticle resins did not show adequate stability on the light test (106/60/90). Although, edge ingress in the barrier film laminated sample was virtually zero after 120 hours for IBOA/YR301 with 1 wt. % IRG819 (282B), the drop in stability was more pronounced than 281C. The higher initiator concentration in 282B may have caused bleaching of the film during the light test. FIG. 1 and FIG. 2 show the difference in stability. It is contemplated that the mixing of the inner phase and the outer phase in 282B was possibly not efficient (incomplete phase separation was observed by optical microscopy of a film prepared from 282B resin) and was likely the cause of the observed drop in stability (see explanation infra).

Figure 3:
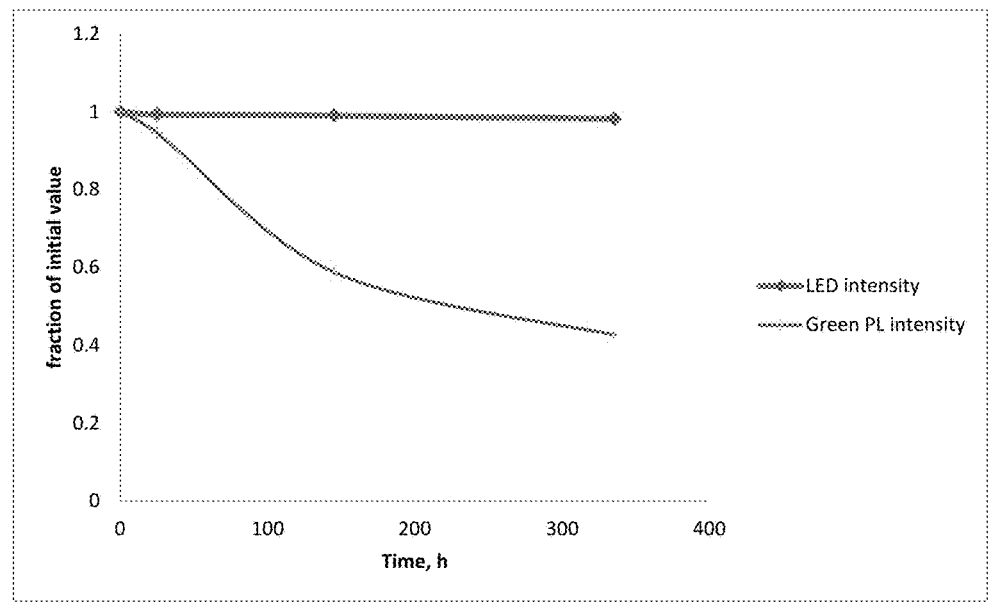
FIG. 3 is a graph showing the results of a dark stability test (0/60/90) for film prepared from 281A resin (LMA/TMPTMA/(YR011/0.36 wt. % IRG819)).
Figure 4:
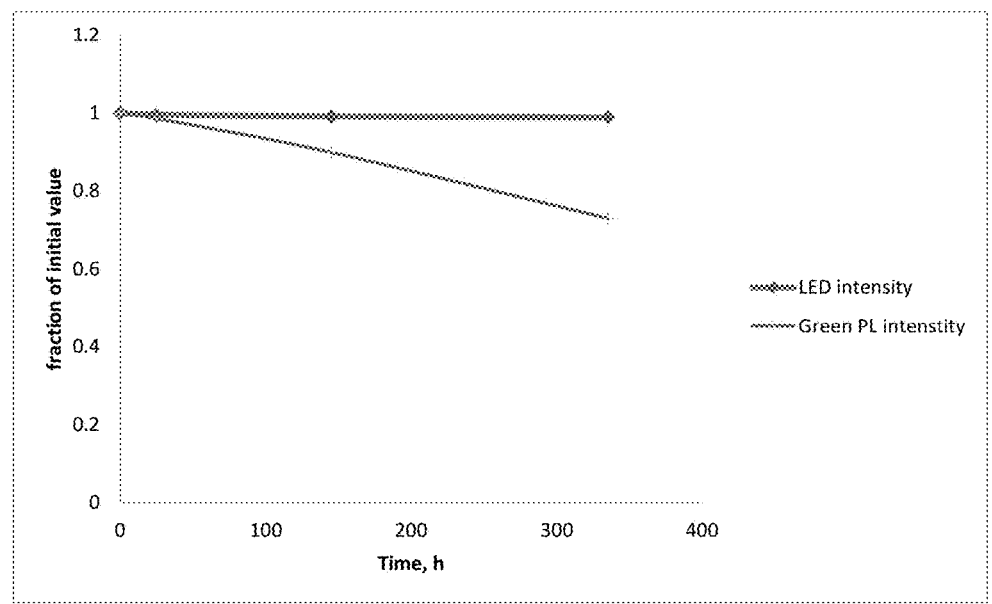
FIG. 4 is a graph showing the results of a dark stability test (0/60/90) for film prepared from 281C resin (IBOA/(YR011/0.36 wt. % IRG819)).

Two of these samples were subjected to a dark test at 90% humidity (0/60/90) and the difference in stability between LMA/TMPTMA and IBOA inner phases is shown in FIGS. 3 and 4 (different quantum dots used).

Figure 5:
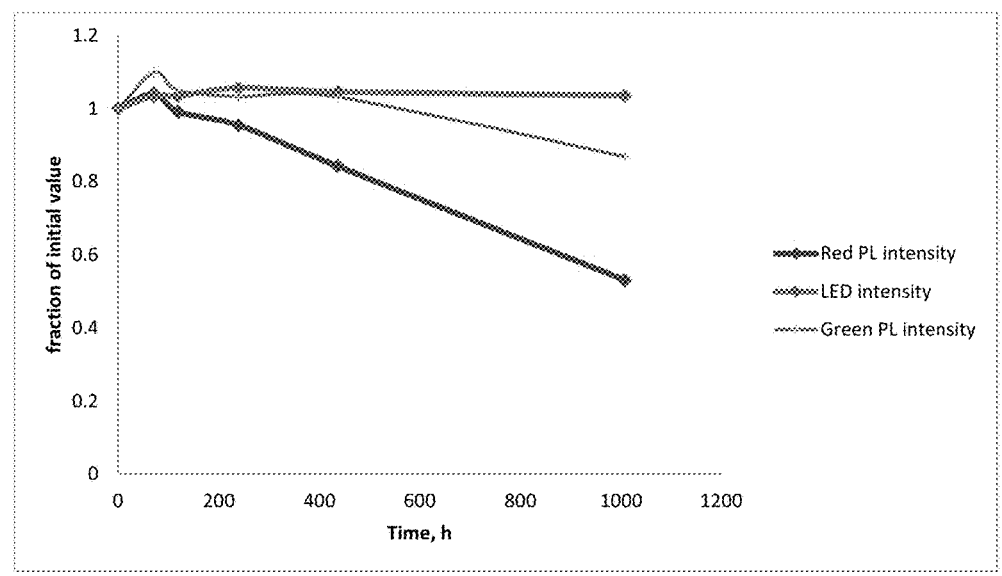
FIG. 5 is a graph showing the results of a light stability test (106/60/90) for film prepared (298B) from IBOA/CN104C80 resin.
Figure 6:
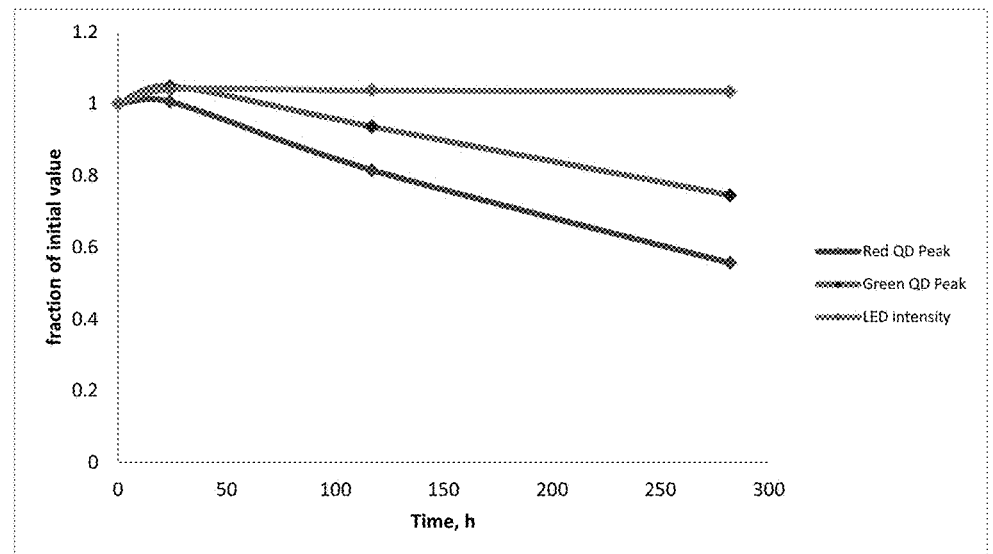
FIG. 6 is a graph showing the results of a dark stability test (0/60/90) for film prepared (298B) from IBOA/CN104C80 resin.

For the CN104C80 outer phase (298), there was no difference observed between curing for 15 and 30 seconds. The results of light and dark stability test are shown in FIG. 5 and FIG. 6.

A number of outer and inner phases were tested. The examples include three outer phases and three inner phases as they best illustrate the stability of the systems. Red-emitting quantum dots at a concentration of 2.40 mg/g were used to prepare films between i-Components Co. 50-μm barrier films at a thickness of 50 μm.

Outer Phase Examples:

1. CN104E70C5 outer phase (69.3 wt. % CN104; 24.75 wt. % 2-hydroxyethyl methacrylate (HEMA); 4.95 wt. % 2-hydroxyethyl acrylate (HEA); 125 ppm 4-Hydroxy-TEMPO inhibitor; 1 wt. % IRG 819).

2. YR301 outer phase (99.0 wt. % YR301; 1.0 wt. % IRG819; 125 ppm 4-Hydroxy-TEMPO inhibitor).

3. SR833S outer phase (99.0 wt. % SR833S; 1.0 wt. % IRG819; 125 ppm 4-hydroxy-TEMPO inhibitor).

Inner Phase Preparation and Mixing with Above Outer Phase Examples:

1. Red-emitting, heavy metal-free, semiconductor nanoparticles (PL=633 nm, FWHM=57 nm, QY=78%) in toluene were dried under high vacuum and re-dispersed in IBOA at a concentration of 23.8 mg/g by stirring overnight. The concentrated quantum dot solution was further diluted with IBOA and IRG819 was added at a concentration of 0.3 wt. % to provide a final concentration of 11.9 mg/g. This inner phase (20 wt. %) was mixed at 500 rpm with outer phase for 10 minutes to provide a red-emitting quantum dot concentration of 2.4 mg/g.

2. Red-emitting, heavy metal-free, semiconductor nanoparticles in toluene were dried under high vacuum and redispersed in IBOA at a concentration of 23.8 mg/g by stirring overnight. The concentrated quantum dot solution was further diluted with IBOA and mixed with Cithrol DPHS (final concentration of 2.5 wt. % in inner phase) at 40° C. for 1 hr. After cooling, IRG819 was added at concentration of 0.3 wt. % to provide a final concentration of 11.9 mg/g. This inner phase (20 wt. %) was mixed at 500 rpm with outer phase for 10 minutes to provide a red-emitting quantum dot concentration of 2.4 mg/g.

3. Red-emitting, heavy metal-free, semiconductor nanoparticles in toluene were dried under high vacuum and redispersed in IBOA at a concentration of 23.8 mg/g by stirring overnight. The concentrated quantum dot solution was further diluted with IBOA and TMPTA (5 wt. % of inner phase) and IRG819 was added at concentration of 0.3 wt. % to provide a final concentration of 11.9 mg/g. This inner phase (20 wt. %) was mixed at 500 rpm for 10 minutes with outer phase to provide a red-emitting quantum dot concentration of 2.4 mg/g.

CN104E70C5-based Resins (Blend of Bisphenol A Epoxy Diacrylate Oligomer, 2-hydroxymethyl Methacrylate and 2-hydroxyethyl Acrylate)

The resins prepared are listed in TABLE 3.

TABLE 3

Resins prepared from CN104E70C5 and IBOA-based inner phases (IP) and optical properties of films. Films were prepared at day 0, day 5 and day 14 from the same resin after remixing. Day 0 and Day 14 films were photo-brightened (PB) by exposure on a backlight unit for 16 hours.

| Film Code | Inner Phase (20%) | QY at 450 nm (%) | EQE (%) | LED Abs (%) | Red PL/FWHM (nm) | CIEx | CIEy | Luminous Flux (lumens) |
|---|---|---|---|---|---|---|---|---|
| 383A Day 0 | IBOA | 59 | 34.0 | 18 | 655/58 | 0.18 | 0.036 | 147 |
| 383A Day 5 | IBOA | 52 | 30.7 | 17 | 656/58 | | | |
| 383A Day 14 | IBOA | 52 | 35.1 | 19 | 655/59 | | | |
| 383A Day 0 (PB) | IBOA | 58 | 36.1 | 18 | 655/57 | | | |
| 383A Day 14 (PB) | IBOA | 59 | 37.7 | 19 | 654/57 | | | |
| 383B Day 0 | IBOA/2.5% CITHROL | 61 | 36.5 | 16 | 654/57 | 0.18 | 0.036 | 156 |
| 383B Day 5 | IBOA/2.5% CITHROL | 55 | 29.3 | 14 | 653/57 | 0.175 | 0.033 | 152 |
| 383B Day 14 | IBOA/2.5% CITHROL | 46 | 25.5 | 12 | 655/57 | | | |
| 383B Day 0 (PB) | IBOA/2.5% CITHROL | 59 | 38.3 | 16 | 653/56 | | | |
| 383B Day 14 (PB) | IBOA/2.5% CITHROL | 54 | 28.1 | 11 | 653/56 | | | |
| 383C Day 0 | IBOA/5 MOL % TMPTA | 58 | 34.0 | 18 | 655/58 | 0.018 | 0.036 | 148 |
| 383C Day 5 | IBOA/5 MOL % TMPTA | 54 | 32.5 | 18 | 655/58 | 0.179 | 0.035 | 143 |
| 383C Day 14 | IBOA/5 MOL % TMPTA | 53 | 34.9 | 19 | 655/58 | | | |
| 383C Day 0 (PB) | IBOA/5 MOL % TMPTA | 57 | 36.5 | 17 | 656/57 | | | |
| 383C Day 14 (PB) | IBOA/5 MOL % TMPTA | 59 | 37.1 | 19 | 656/57 | | | |

The pot life of the resins (except sample B) was good, and clear films were obtained upon coating. A minimal decrease in red shift was observed when Cithrol was used suggesting that Cithrol only marginally improves the dispersion of quantum dots in IBOA. The microscope images for the films all displayed clear inner domains dispersed in outer phase.

Figure 7:
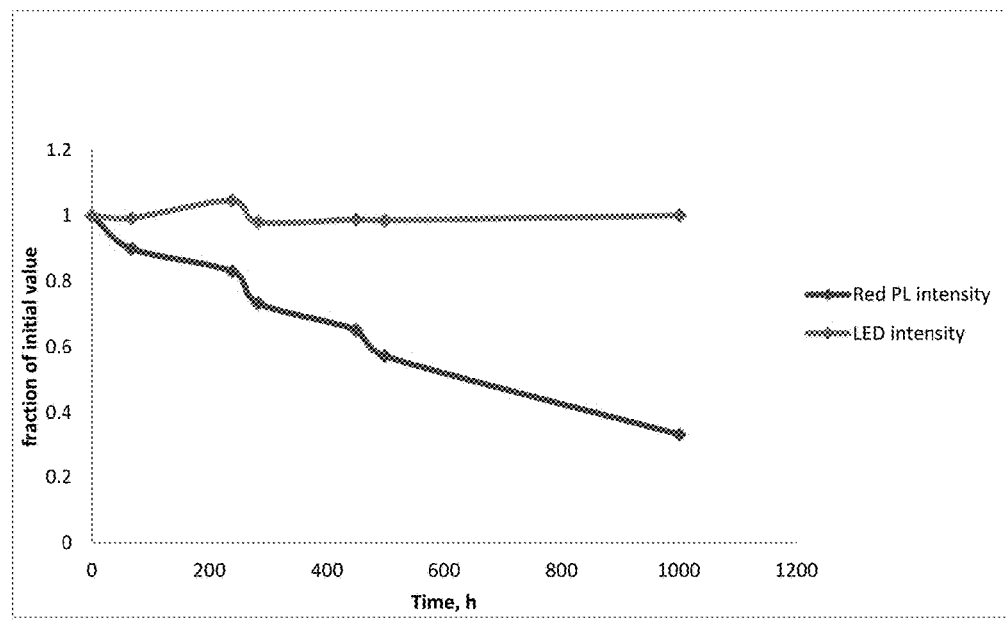
FIG. 7 is a graph showing the results of a dark stability test (0/60/RH) for film prepared (383C) from (IBOA/TMPTA)/CN104E70C5.
Figure 8:
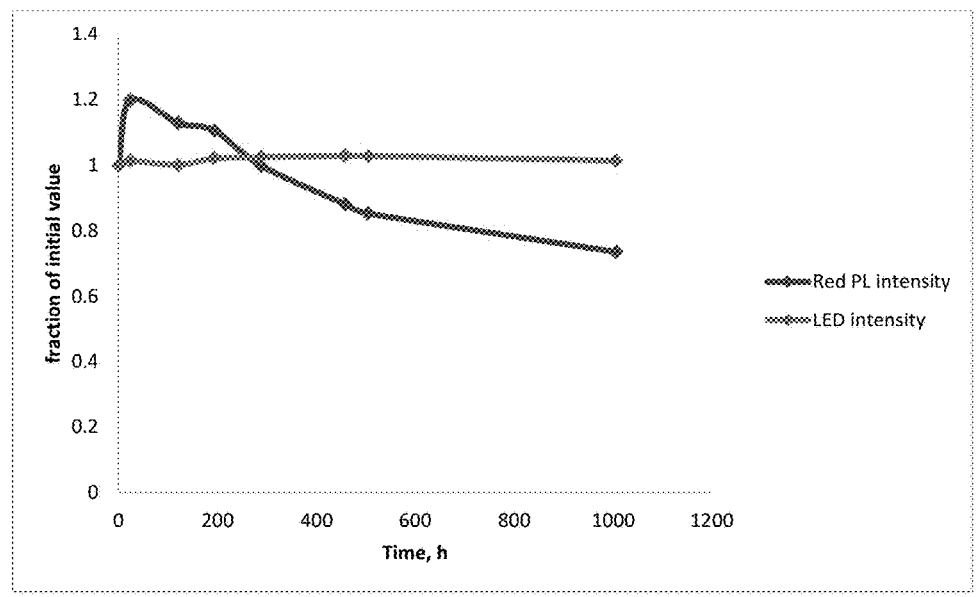
FIG. 8 is a graph showing the results of a light stability test (106/60/90) for film prepared (383C) from (IBOA/TMPTA)/CN104E70C5.
Figure 9:
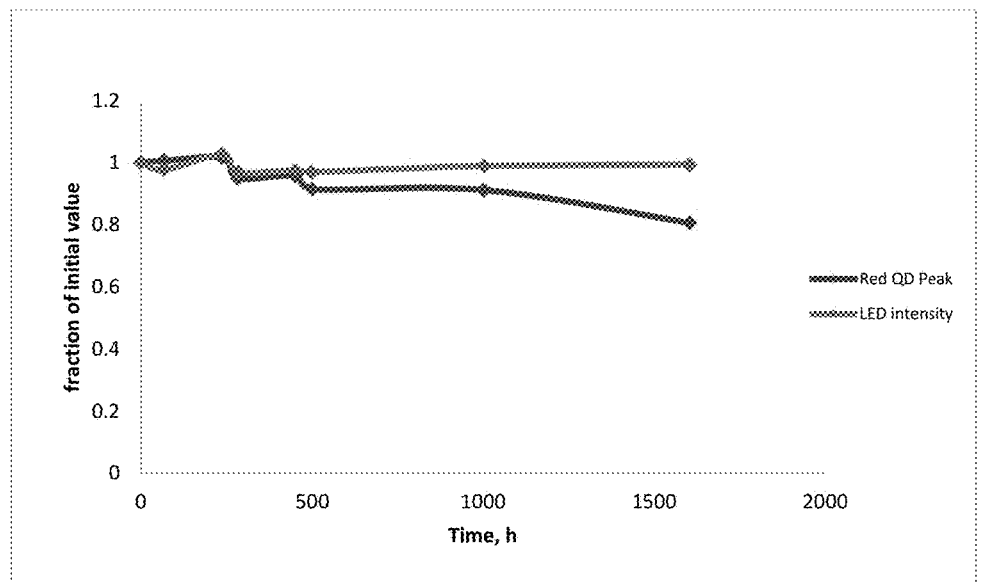
FIG. 9 is a graph showing the results of a dark stability test (0/60/RH) for film prepared (383I) from IBOA/NR301.
Figure 10:
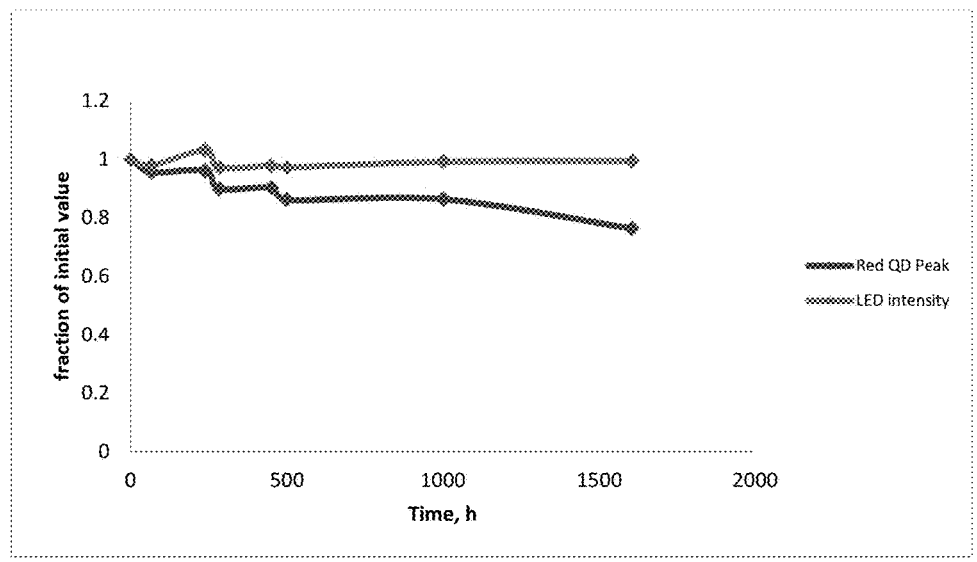
FIG. 10 is a graph showing the results of a dark stability test (0/60/RH) for film prepared (383J) from (IBOA/Cithrol) NR301.
Figure 11:
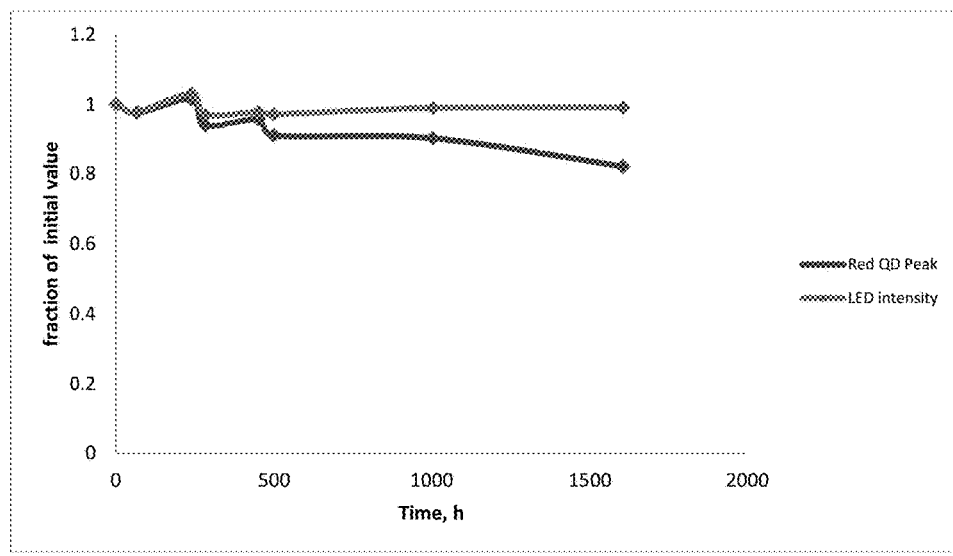
FIG. 11 is a graph showing the results of a dark stability test (0/60/RH) for film prepared (383K) from (IBOA/TMPTA)/YR301.
Figure 12:
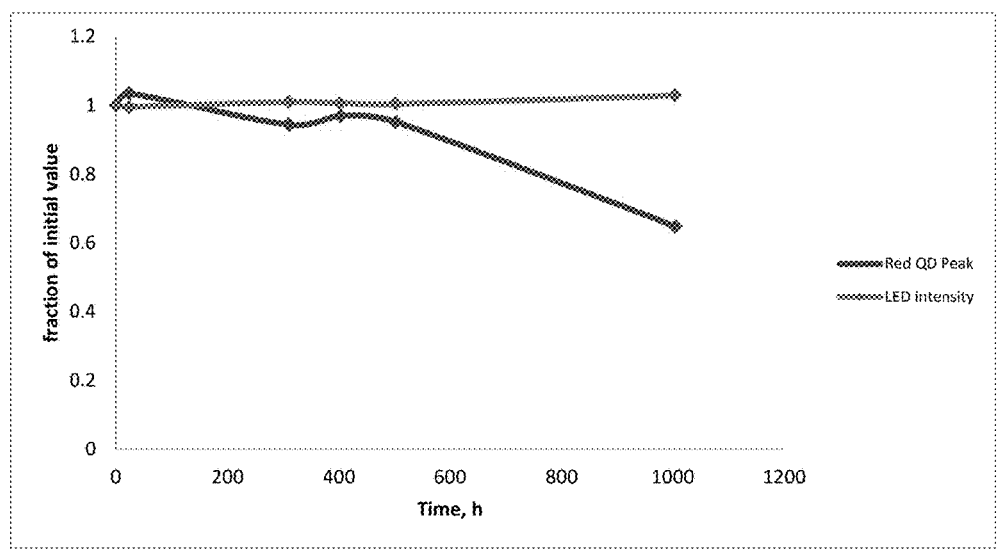
FIG. 12 is a graph showing the results of a light stability test (106/60/90) for film prepared (383I) from IBOA/NR301.
Figure 13:
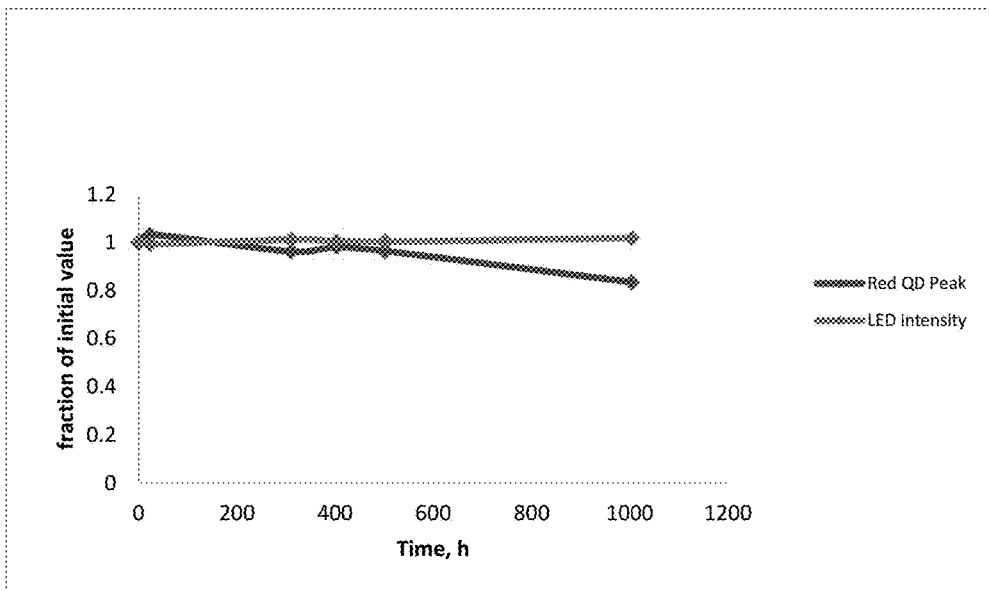
FIG. 13 is a graph showing the results of a light stability test (106/60/90) for film prepared (383J) from (IBOA/Cithrol)NR301.
Figure 14:
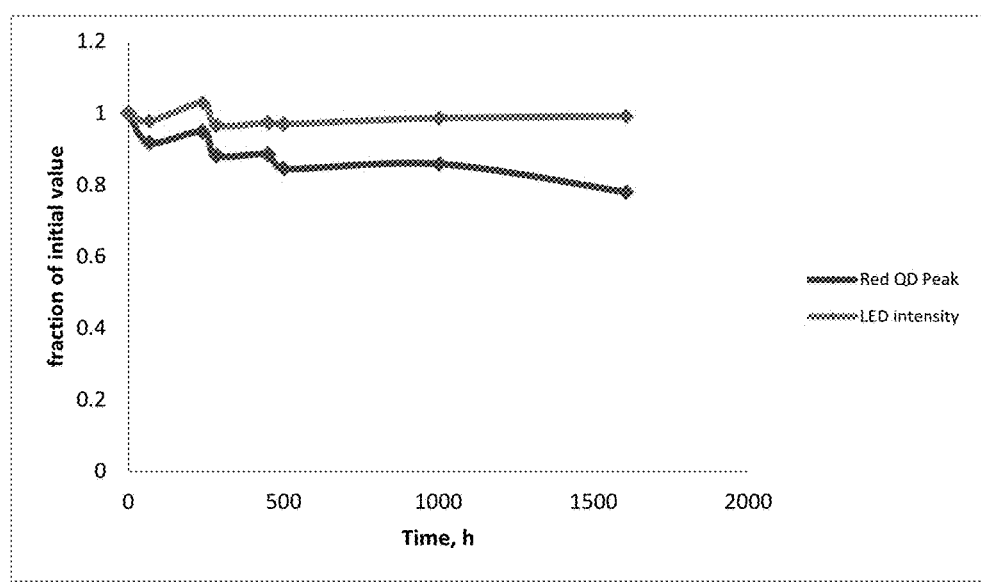
FIG. 14 is a graph showing the results of a dark stability test (0/60/RH) for film prepared (383E) from IBOA/SR833S.
Figure 15:
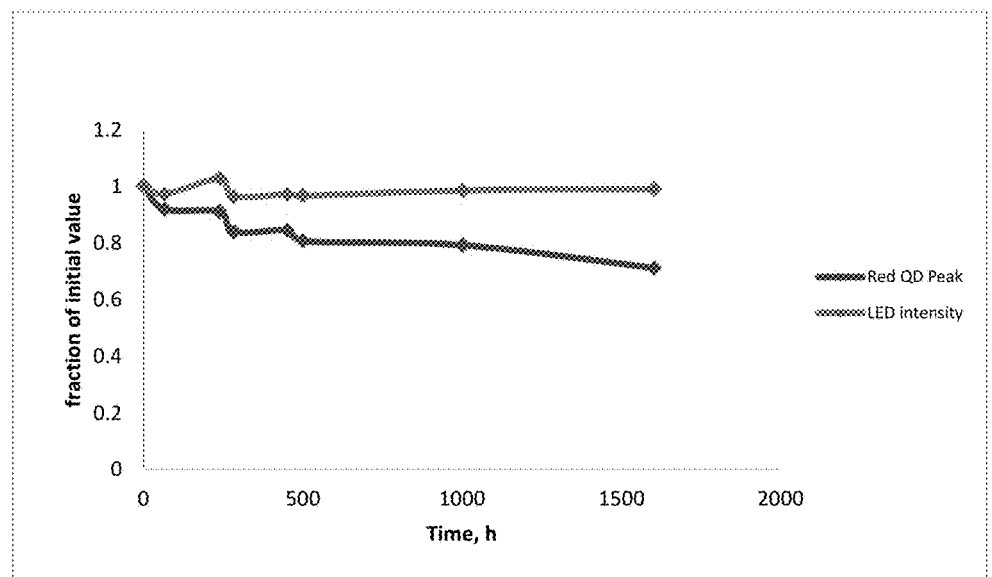
FIG. 15 is a graph showing the results of a dark stability test (0/60/RH) for film prepared (383F) from ((IBOA/Cithrol)/SR833S).
Figure 16:
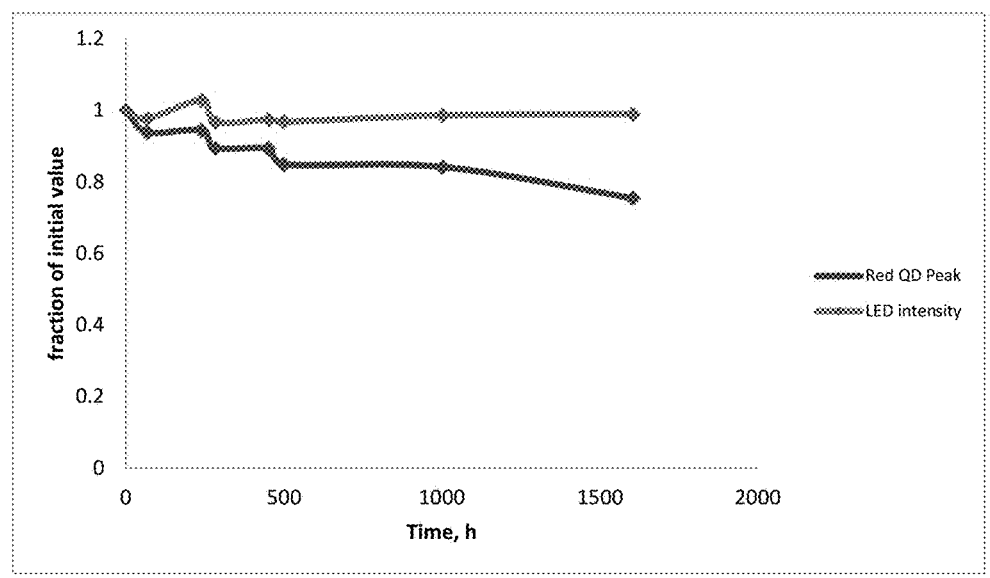
FIG. 16 is a graph showing the results of a dark stability test (0/60/RH) for film prepared (383G) from ((IBOA/TMPTA)/SR833S).
Figure 17:
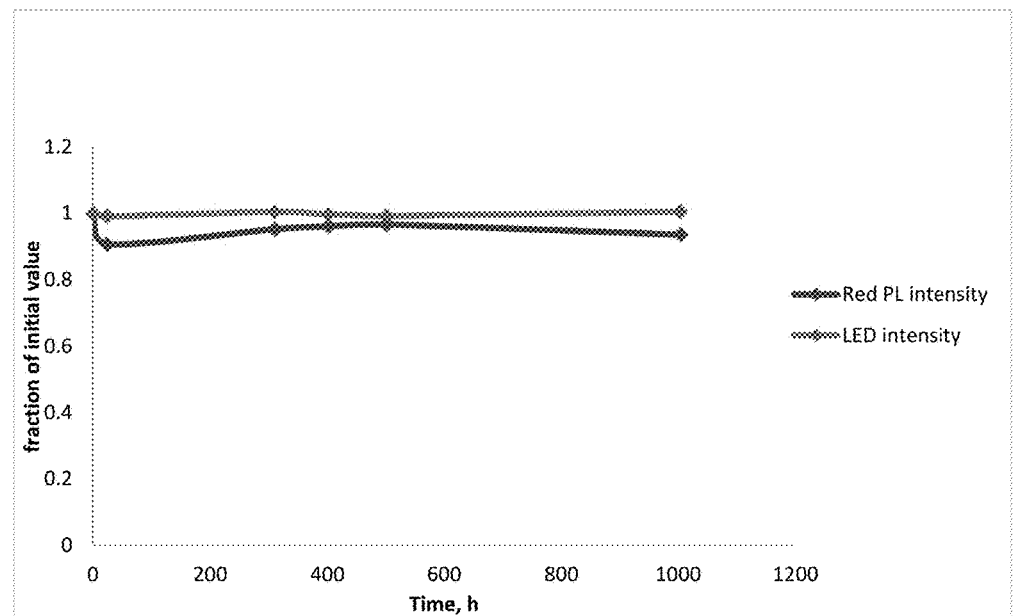
FIG. 17 is a graph showing the results of a light stability test (106/60/90) for film prepared (383F) from (IBOA/Cithrol)/SR833S.
Figure 18:
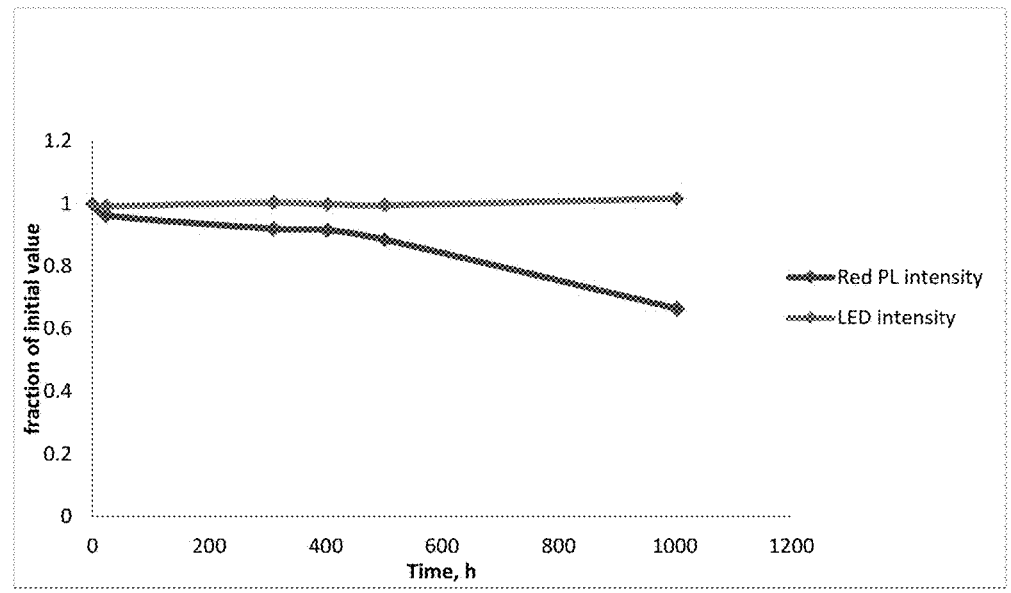
FIG. 18 is a graph showing the results of a light stability test (106/60/90) for film prepared (383G) from (IBOA/TMPTA)/SR833S.

All the samples exhibited poor dark stability (0/60/RH) and the sample with TMPTA (383C) had slightly longer lifetime for light stability (106/60/90). It is clear that this CN104-based resin (as is the case with standard CN104/IPM-based resins) is less stable for semiconductor nanoparticles in the dark test. It is contemplated that the high polarity of its components (e.g. HEMA) allows water to permeate into the film. Modifying the outer phase with less water soluble components may improve stability. FIGS. 7 and 8 illustrate the stability of 383C.

YR301-based Resins (Acrylate-functionalized Silica Nanoparticle Resin)

The resins prepared are listed in TABLE 4.

TABLE 4

Resins prepared from YR301 and IBOA-based inner phases and optical properties of films. Films were prepared at day 0, day 5 and day 14 from the same resin after remixing. Day 0 and Day 14 films were photo-brightened (PB).

| Film Code | Inner Phase (IP) | Outer Phase (OP) | QY at 450 nm (%) | EQE (%) | LED Abs (%) | Red PL/FWHM (nm) | CIEx | CIEy | Luminous Flux (lumens) |
|---|---|---|---|---|---|---|---|---|---|
| 383I Day 0 | IBOA | YR301 | 60 | 35.9 | 21 | 653/58 | 0.188 | 0.04 | 150 |
| 383I Day 5 | IBOA | YR301 | 56 | 33.4 | 22 | 656/60 | 0.187 | 0.039 | 145 |
| 383I Day 14 | IBOA | YR301 | 54 | 37.3 | 22 | 656/60 | | | |
| 383I Day 0 (PB) | IBOA | YR301 | 58 | 38.9 | 20 | 655/57 | | | |
| 383I Day 14 (PB) | IBOA | YR301 | 57 | 40.1 | 22 | 655/59 | | | |
| 383J Day 0 | IBOA/2.5% CITHROL | YR301 | 61 | 36.2 | 17 | 653/57 | 0.19 | 0.041 | 161 |
| 383J Day 5 | IBOA/2.5% CITHROL | YR301 | 57 | 33.7 | 17 | 652/58 | | | |
| 383J Day 14 | IBOA/2.5% CITHROL | YR301 | 57 | 37.5 | 20 | 652/58 | | | |
| 383J Day 0 (PB) | IBOA/2.5% CITHROL | YR301 | 55 | 36.6 | 17 | 650/57 | | | |
| 383J Day 14 (PB) | IBOA/2.5% CITHROL | YR301 | 55 | 38.2 | 20 | 651/57 | | | |
| 383K Day 0 | IBOA/5 MOL % TMPTA | YR301 | 60 | 36.0 | 21 | 654/57 | 0.189 | 0.04 | 151 |
| 383K Day 5 | IBOA/5 MOL % TMPTA | YR301 | 55 | 36 | 20 | 655/59 | | | |

TABLE 4-continued

Resins prepared from YR301 and IBOA-based inner phases and optical properties of films. Films were prepared at day 0, day 5 and day 14 from the same resin after remixing. Day 0 and Day 14 films were photo-brightened (PB).

| Film Code | Inner Phase (IP) | Outer Phase (OP) | QY at 450 nm (%) | EQE (%) | LED Abs (%) | Red PL/FWHM (nm) | CIEx | CIEy | Luminous Flux (lumens) |
|---|---|---|---|---|---|---|---|---|---|
| 383K Day 14 | IBOA/5 MOL % TMPTA | YR301 | 54 | 37.3 | 22 | 655/59 | | | |
| 383K Day 0 (PB) | IBOA/5 MOL % TMPTA | YR301 | 58 | 37.1 | 21 | 654/58 | | | |
| 383K Day 14 (PB) | IBOA/5 MOL % TMPTA | YR301 | 58 | 40.4 | 22 | 655/59 | | | |

The pot life of the resins was good and clear films were obtained on coating. The absorbance was slightly higher for YR301 than CN104E70C5. In microscope images, clear inner domains could be seen except for the sample containing Cithrol DPHS where the phase separation was no longer clear.

Stability plots are presented in FIGS. 9-13. For the dark stability tests, excellent stability was observed for the IBOA-only inner phase especially during the first 500 hours with the QD peak plot closely matching the LED peak intensity plot. The addition of Cithrol DPHS has a negative effect with a greater deviation between the two lines in the early stages. This is expected inasmuch as the addition of a waxy non-curing material would result in softening of the outer phase. The addition of TMPTA also causes a slightly bigger deviation possibly because of the diffusion of polar TMPTA into the outer phase.

For the light stability plots, samples 383I and 383J were stable after 500 hours but the Cithrol-containing sample remained more stable past 500 hrs. The mixing in 383I is believed to be better than in 282B (the only differences being green quantum dots were used and the final resin was less fluid after mixing) giving clear phase separation between the inner and outer phases. This may result in a better gas barrier resin and better protection of the inner phase from the high initiator concentration in the outer phase hence providing much better initial stability.

In general, the use of YR301 with a fast-curing, high-$T_g$ inner phase is preferred in terms of dark stability.

SR833S-based Resins (Tricyclodecane Dimethanol Diacrylate Resin)

The resins prepared are listed in TABLE 5.

TABLE 5

Resins prepared from SR833S and IBOA-based inner phases and optical properties of films. Films were prepared at day 0, day 5 and day 14 from the same resin after remixing. Day 0 and day 14 films were photo-brightened (PB).

| Film Code | Inner Phase (IP) | Outer Phase (OP) | QY at 450 nm (%) | EQE (%) | LED Abs (%) | Red PL/FWHM (nm) | CIEx | CIEy | Luminous Flux (lumens) |
|---|---|---|---|---|---|---|---|---|---|
| 383E Day 0 | IBOA | SR833S | 53 | 30.3 | 17 | 655/58 | 0.178 | 0.035 | 148 |
| 383E Day 5 | IBOA | SR833S | 52 | 30.4 | 16 | 654/58 | 0.179 | 0.035 | 146 |
| 383E Day 14 | IBOA | SR833S | 53 | 34.2 | 17 | 655/58 | | | |
| 383E Day 0 (PB) | IBOA | SR833S | 53 | 33.2 | 17 | 653/58 | | | |
| 383E Day 14 (PB) | IBOA | SR833S | 57 | 35.6 | 17 | 655/58 | | | |
| 383F Day 0 | IBOA/2.5% CITHROL | SR833S | 60 | 33.2 | 15 | 645/59 | 0.184 | 0.039 | 179 |
| 383F Day 5 | IBOA/2.5% CITHROL | SR833S | 56 | 31.4 | 15 | 645/61 | 0.185 | 0.04 | 180 |
| 383F Day 14 | IBOA/2.5% CITHROL | SR833S | 57 | 35 | 15 | 642/61 | | | |
| 383F Day 0 (PB) | IBOA/2.5% CITHROL | SR833S | 55 | 30.8 | 15 | 645/61 | | | |
| 383F Day 14 (PB) | IBOA/2.5% CITHROL | SR833S | 57 | 33.5 | 15 | 645/61 | | | |
| 383G Day 0 | IBOA/5 MOL % TMPTA | SR833S | 56 | 32.3 | 16 | 655/57 | 0.181 | 0.036 | 147 |
| 383G Day 5 | IBOA/5 MOL % TMPTA | SR833S | 53 | 30.8 | 16 | 654/59 | | | |
| 383G Day 14 | IBOA/5 MOL % TMPTA | SR833S | 51 | 33.7 | 19 | 656/58 | | | |
| 383G Day 0 (PB) | IBOA/5 MOL % TMPTA | SR833S | 54 | 32.8 | 16 | 654/58 | | | |
| 383G Day 14 (PB) | IBOA/5 MOL % TMPTA | SR833S | 57 | 37.2 | 19 | 655/58 | | | |

The pot life of the resins was good, and clear films were obtained upon coating. In microscope images, inner domains could be seen (less clearly than for CN104E70C5 and YR301) except for the sample containing Cithrol DPHS where the phase separation was no longer clear. Unlike the case for CN104E70C5 and YR301, the red shift was observed to be significantly less with the use of Cithrol.

Stability plots are presented in FIGS. 14-18. The SR833S-based films are less stable than YR301-based films on dark test. Similarly, the addition of Cithrol DPHS had a slight negative effect with a bigger deviation between the QD and peak intensity lines. However, in comparison to most systems available, these samples remained relatively stable as seen by the leveling of the peak intensity over time.

For the light stability plots, samples 383F and 383G were stable after 500 hours with the sample containing Cithrol DPHS showing better stability especially after 1000 hrs. In this resin, where the inner phase and outer phase are closer in polarity, Cithrol may help protect the quantum dots from the high concentration of initiator in the outer phase.

A fast-curing, high-$T_g$ inner phase improves the stability of two-phase resins. Such films exhibit good dark-test stability likely due to the reduction of uncured soft material in the outer phase. Light stability was observed to be good when there was good phase separation between the inner and outer phases (e.g. IBOA/YR301). An additive such as Cithrol may be beneficial when the inner and outer phases are closer to one another in polarity (e.g. IBOA/SR833S).

Advantages of the invention include:
1. The above-described resin systems are commercially scalable.
2. These resins exhibit very good stability (under both light and dark conditions) for 50-micron red-emitting-QD films between i-Components Co. barrier film.
3. Emulsion stability and pot life of the resins are good.

The foregoing presents particular embodiments of a system embodying the principles of the invention. Those skilled in the art will be able to devise alternatives and variations which, even if not explicitly disclosed herein, embody those principles and are thus within the scope of the invention. Although particular embodiments of the present invention have been shown and described, they are not intended to limit what this patent covers. One skilled in the art will understand that various changes and modifications may be made without departing from the scope of the present invention as literally and equivalently covered by the following claims.

What is claimed is:

1. A film comprising:
a plurality of semiconductor nanoparticles dispersed in a cured inner phase that comprises lauryl methacrylate and trimethylolpropane trimethacrylate; and,
an outer phase that comprises an acrylate-functionalized silica nanoparticle resin.

2. The film recited in claim 1 additionally comprising:
an oxygen-barrier film.

3. A film comprising:
a plurality of semiconductor nanoparticles dispersed in a cured inner phase that comprises lauryl methacrylate and trimethylolpropane trimethacrylate; and,
an outer phase that comprises a monofunctional adhesion-promoting acrylic oligomer and a tricyclodecane dimethanol diacrylate.

4. The film recited in claim 3 wherein the outer phase comprises substantially equal amounts of the monofunctional adhesion-promoting acrylic oligomer and the tricyclodecane dimethanol diacrylate.

5. The film recited in claim 3 additionally comprising:
an oxygen-barrier film.

6. The film recited in claim 3 wherein the semiconductor nanoparticles comprise red-emitting quantum dots.

7. The film recited in claim 3 wherein the semiconductor nanoparticles comprise red-emitting quantum dots and green-emitting quantum dots.

8. A film comprising:
a plurality of semiconductor nanoparticles dispersed in an inner phase that comprises isobornyl acrylate and,
an outer phase that comprises a resin that provides a phase separation from the inner phase.

9. The film recited in claim 8 wherein the outer phase comprises an acrylate-functionalized silica nanoparticle resin.

10. The film recited in claim 8 wherein the outer phase comprises a bisphenol A epoxy diacrylate oligomer and 2-hydroxyethyl acrylate.

11. The film recited in claim 10 wherein the outer phase comprises about 80% bisphenol A epoxy diacrylate oligomer and about 20% 2-hydroxyethyl acrylate.

12. The film recited in claim 8 wherein the inner phase additionally comprises lauryl acrylate.

13. The film recited in claim 8 wherein the outer phase comprises an acrylate-functionalized silica nanoparticle resin and the inner phase consists essentially of isobornyl acrylate and semiconductor nanoparticles.

14. The film recited in claim 13 further comprising about 1% by weight of a photo-initiator.

15. The film recited in claim 14 wherein the photo-initiator is bis(2,4,6-trimethylbenzoyl)-phenylphosphineoxide.

16. The film recited in claim 8 wherein the inner phase additionally comprises a stabilizing additive.

* * * * *